United States Patent
Stascausky

(10) Patent No.: US 6,437,615 B1
(45) Date of Patent: Aug. 20, 2002

(54) LOOP FILTER AND METHOD FOR GENERATING A CONTROL SIGNAL IN PHASE-LOCKED LOOP CIRCUITS

(75) Inventor: Casimiro A. Stascausky, Freemont, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/951,252

(22) Filed: Sep. 13, 2001

(51) Int. Cl.[7] .............................................. H03L 7/06
(52) U.S. Cl. ........................................................ 327/156
(58) Field of Search ............................ 327/141, 146–150, 327/155–159, 551–555, 558; 375/376

(56) References Cited

U.S. PATENT DOCUMENTS 5,477,193 A * 12/1995 Burchfield ..................... 331/8
5,831,484 A * 11/1998 Lukes et al. ................. 327/157
5,874,863 A *  2/1999 Wojewoda et al. ........... 331/17
6,163,184 A * 12/2000 Larsson ....................... 327/147
6,320,470 B1 * 11/2001 Arai et al. ................... 327/112

* cited by examiner

Primary Examiner—My-Trang Nu Ton
(74) Attorney, Agent, or Firm—Hitt Gaines & Boisbrun, P.C.

(57) ABSTRACT

A loop filter, method of generating a control signal and a phase-locked loop circuit employing the loop filter or the method. In one embodiment, the loop filter includes a capacitor having a charge rate proportional to a current therethrough and configured to provide an output signal therefrom. The loop filter also includes a current bypass circuit, coupled to the capacitor, configured to reduce the current through the capacitor and thereby reduce the charge rate of the capacitor.

30 Claims, 5 Drawing Sheets

LOOP FILTER AND METHOD FOR GENERATING A CONTROL SIGNAL IN PHASE-LOCKED LOOP CIRCUITS

TECHNICAL FIELD OF THE INVENTION

The present invention is directed, in general, to phase-locked loop (PLL) circuits and, more specifically, to a loop filter employable in PLL circuits and a related method of generating an output signal.

BACKGROUND OF THE INVENTION

In modern digital electronic computers, cooperating sequential logic circuits, where each performs several routine operations, are each controlled by derivatives of a master clock signal. These derivative clock signals are typically synchronized within the system to assist in optimizing computer functions, although they often do not arrive at their intended destinations in proper synchronism. Reasons for such skew in the derivative signals include, for example, variations in signal propagation delay for each destination. As a result, combining several complex synchronous logic circuits within a system presents a challenge with respect to synchronizing the clock signals transmitted to the respective circuits therein.

As high density, high speed application specific integrated circuits (ASICs) and high density programmable logic devices (PLDs) become available, on-chip clock distribution becomes more important to the integrity and performance of the designs implemented in these devices. Unfortunately, with the advent of ASICs and high-density PLDs, difficulties in managing clock delay and clock skew on these devices has become substantial. Many existing solutions for such problems, such as hardwired clock trees, are less effective for the applications found in today's programmable logic market. As integration levels of microelectronic circuits and system complexity continue to increase, the routing or distribution of a master system clock has become even more critical. This challenge is especially exacerbated in view of ever increasing clock rates in today's powerful microprocessors.

A common solution is the incorporation of a circuit having a phase-locked loop (PLL) architecture to assist in synchronizing and controlling the timing of clock signals in such devices. Because of the advantages, employing a voltage controlled oscillator (VCO) in a clock management circuit to create a PLL architecture has continued to gain popularity among device designers. Such oscillators adjust the various signals, such that the internal clock signals correspond to, or vary as a function of, a reference signal derived from a master clock signal. By doing so, the PLL architecture provides feedback that is used to nullify clock distribution problems, such as skew and jitter, within the circuit by comparing the master clock signal with that of a feedback signal. The difference between the two signals is used in a feedback control system to bring the signals into a fixed phase relation. Logical circuits implemented with AND and NOR gates compare the master clock signal or reference signal with the feedback signal to provide an output signal to control the VCO. More specifically, the master clock signal is compared with the feedback signal and the output signal is generated in response to the difference. In addition, a frequency divider may also be included in the feedback path when frequency multiplication is desired.

In conventional devices, those skilled in the art understand that this process is typically performed by a phase detector and charge pump. The phase detector and charge pump provide a current with a value proportional to the phase difference between the master clock signal and the feedback signal. The charge pump current is then fed into a loop filter for conversion to a voltage output signal used to control the VCO to generate the desired signals. To generate a voltage output signal, loop filters are typically created using a simple capacitor circuit, such as the conventional loop filter 120 illustrated in FIG. 1. As illustrated, a charge pump 110 is coupled in series with the loop filter 120, which includes a capacitor $C_1$ (as well as other components not illustrated), and is used to generate a voltage output signal $V_{out}$ to control a voltage-controlled oscillator (not illustrated). Those skilled in the art understand that the loop filter 120 may be constructed adding resistors or other devices placed in series with the capacitor $C_1$ or by simply placing the capacitor $C_1$ in a "feed forward zero" circuit configuration, as is known in the art.

Regardless of the configuration, the charge pump 110 delivers a charge pump current $I_{cp}$ to the capacitor $C_1$, which is to be converted to the voltage output signal $V_{out}$ by the loop filter 120. As the charge pump current $I_{cp}$ passes through the capacitor $C_1$, the capacitor $C_1$ becomes charged by a charge voltage $\Delta V$. As a result, a charge/discharge rate $R_{c/d}$ of the capacitor $C_1$ may be defined by the following equation:

$$R_{c/d} = \frac{\Delta V}{\Delta t} = \frac{I_{cp}}{C_1}$$

where $\Delta t$ is the time during which the capacitor $C_1$ is charged or discharged. Typically, PLL architectures require a slow voltage variation across the filter capacitor $C_1$ or a small charge voltage $\Delta V$. Using the equation above it can seen that a slow voltage variation during charging or discharging results in a lower charge/discharge rate $R_{c/d}$.

Although the goal of a low charge/discharge rate $R_{c/d}$ appears simple in theory, reducing the principle to actual practice has proven problematic. Specifically, the equation demonstrates that a lower charge/discharge rate $R_{c/d}$ may be attained by either decreasing the charge pump current $I_{cp}$ (directly proportional to the rate $R_{c/d}$) charging the capacitor $C_1$, or by increasing the capacitance (inversely proportional to the rate $R_{c/d}$) of the capacitor $C_1$. However, sustaining a low constant charge pump current $I_{cp}$ in an effort to lower the charge/discharge rate $R_{c/d}$ is problematic due to leakages that occur across the charge pump 110, making the smaller charge pump current $I_{cp}$ difficult to control. As a result, manufacturers are left with the choice of increasing the capacitance in the loop filter. Unfortunately, the size of the capacitor $C_1$ is generally limited by the available area on a semiconductor chip. Due to the high cost of chip surface area and the continuing desire to miniaturize components, semiconductor manufacturers are understandably eager to avoid increasing the size of the capacitors.

Accordingly, what is needed in the art is an improved loop filter and related method of generating an output signal that do not suffer from the deficiencies associated with the conventional designs.

SUMMARY OF THE INVENTION

To address the above-discussed deficiencies of the prior art, the present invention provides an improved loop filter configured to generate a control signal. In one embodiment, the loop filter includes a capacitor having a charge rate proportional to a current therethrough and configured to provide an output signal therefrom. The loop filter also includes a current bypass circuit, coupled to the capacitor, configured to reduce the current through the capacitor and thereby reduce the charge rate of the capacitor.

In another aspect of the present invention, a method of generating an output signal is provided. In one embodiment, the method may include providing current through a capacitor having a charge rate proportional to the current and creating an output signal therefrom. The method further includes coupling a current bypass circuit with the capacitor. The method still further includes reducing the current through the capacitor with the current bypass circuit, thereby reducing the charge rate of the capacitor.

In yet another aspect, the present invention provides a PLL circuit including a comparator circuit configured to compare a phase of a feedback signal to a phase of an input signal and generate a signal as a function of the comparison. In addition, the PLL circuit may include a charge pump configured to generate a current as a function of the signal from the comparator circuit, as well as a loop filter couplable to the charge pump. In such an embodiment, the loop filter may include a capacitor having a charge rate proportional to the current and configured to provide an output signal therefrom. The loop filter may also include a current bypass circuit, coupled to the capacitor, configured to reduce the current through the capacitor and thereby reduce the charge rate of the capacitor. The PLL circuit may still further include an oscillator configured to generate an output clock signal as a function of the output signal from the loop filter.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

Figure 1:
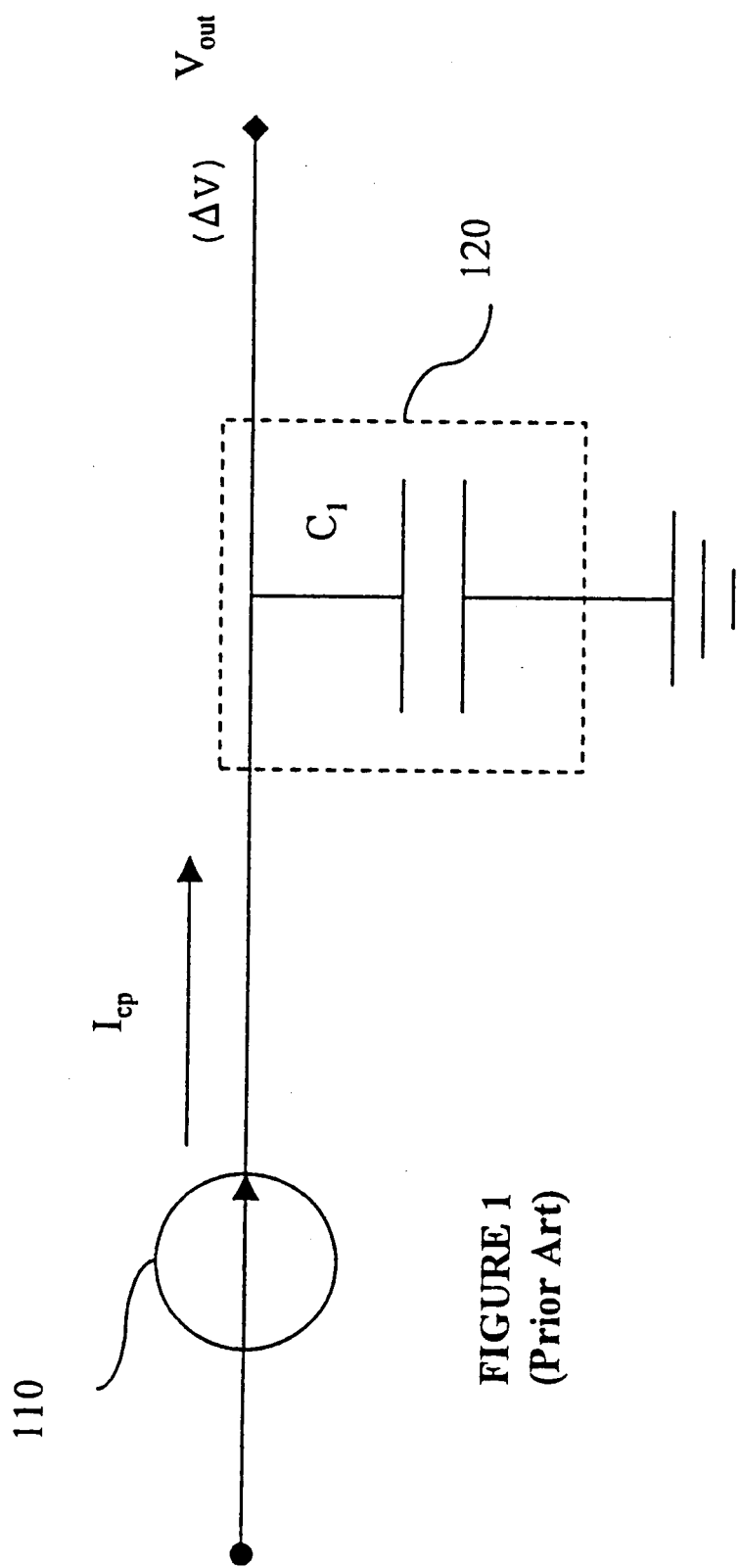
FIG. 1 illustrates a diagram of a conventional loop filter found in the prior art.
Figure 2:
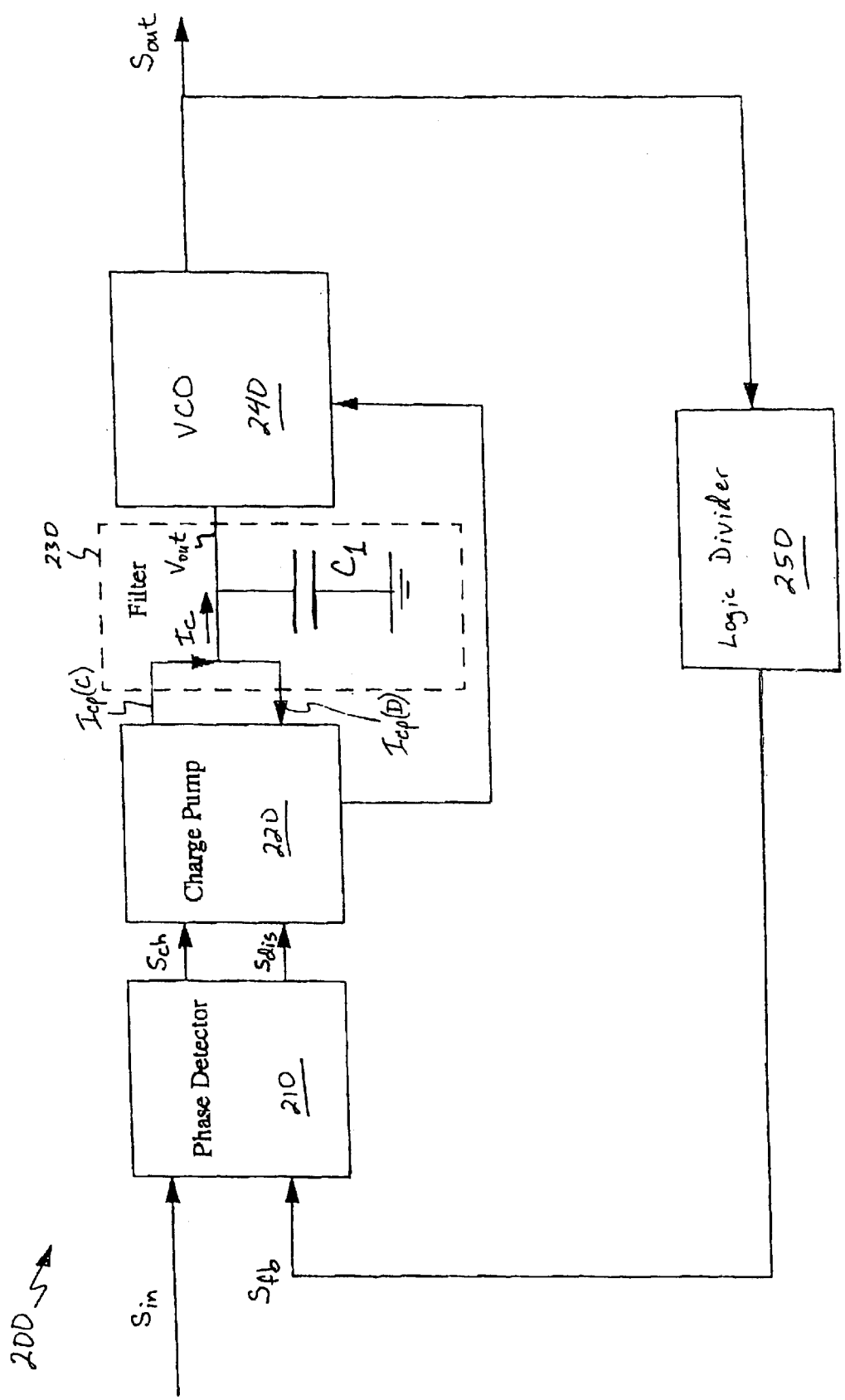
FIG. 2 illustrates a block diagram of an embodiment of a phase-locked loop circuit that may provide an environment for a loop filter constructed according to the principles of the present invention.

Referring now to FIG. 2, illustrated is a block diagram of an embodiment of a phase-locked loop (PLL) circuit 200 that may provide an environment for a loop filter constructed according to the principles of the present invention. The PLL circuit 200 accepts an input signal (e.g., a master clock signal) $S_{in}$ and a feedback signal $S_{fb}$, and includes a phase detector 210 used for comparing both the signals $S_{in}$, $S_{fb}$, input to the PLL circuit 200. Of course, other types of comparator circuits, having different components, may be used to determine differences in signals, and the present invention is not limited to any particular one.

The phase detector 210 has two output signals, a charge signal $S_{ch}$ and a discharge signal $S_{dis}$ which are input to a charge pump 220. The charge pump 220 generates a charge current $I_{cp(C)}$ during charging or causes a discharge current $I_{cp(D)}$ to flow back to itself during discharging. The PLL circuit 200 also includes a loop filter 230, coupled to the charge pump 220. In response to the charge current $I_{cp(C)}$ or the discharge current $I_{cp(D)}$, a capacitor current $I_c$ flows through a capacitor $C_1$ within the loop filter 230. Of course, in other embodiments, the loop filter 230 may include additional components for filtering current signals from the charge pump 220. The capacitor $C_1$ and the charge pump 220 have a charge/discharge rate $R_{c/d}$, as defined by the above-mentioned equation, based on the capacitor current $I_c$ flowing through the capacitor $C_1$, as well as the capacitance of the capacitor $C_1$. The loop filter 230 generates an output signal (e.g., a output voltage control signal $V_{out}$) as a function of that charge/discharge rate $R_{c/d}$ and sends that output signal $V_{out}$ to a voltage controlled oscillator (VCO) 240.

The VCO 240 converts the output signal $V_{out}$ to a desired output clock signal $S_{out}$ and transmits the signal to other circuits or components associated with the PLL circuit 200. In addition, the output clock signal $S_{out}$ is also fed through a logic divider 250 to provide the feedback signal $S_{fb}$. If desired, the logic divider 250 may be used to alter the output clock signal $S_{out}$ with respect to the input clock signal $S_{in}$. For example, in one embodiment, the logic divider 250 may be used to alter the frequency of the output clock signal $S_{out}$ so that it differs from the frequency of the input signal $S_{in}$ as it is fed back to the phase detector 210. Those skilled in the art understand the details and advantages of performing such frequency synthesis within a clock management circuit having a PLL architecture, so that discussion will not herein be presented.

Figure 3:
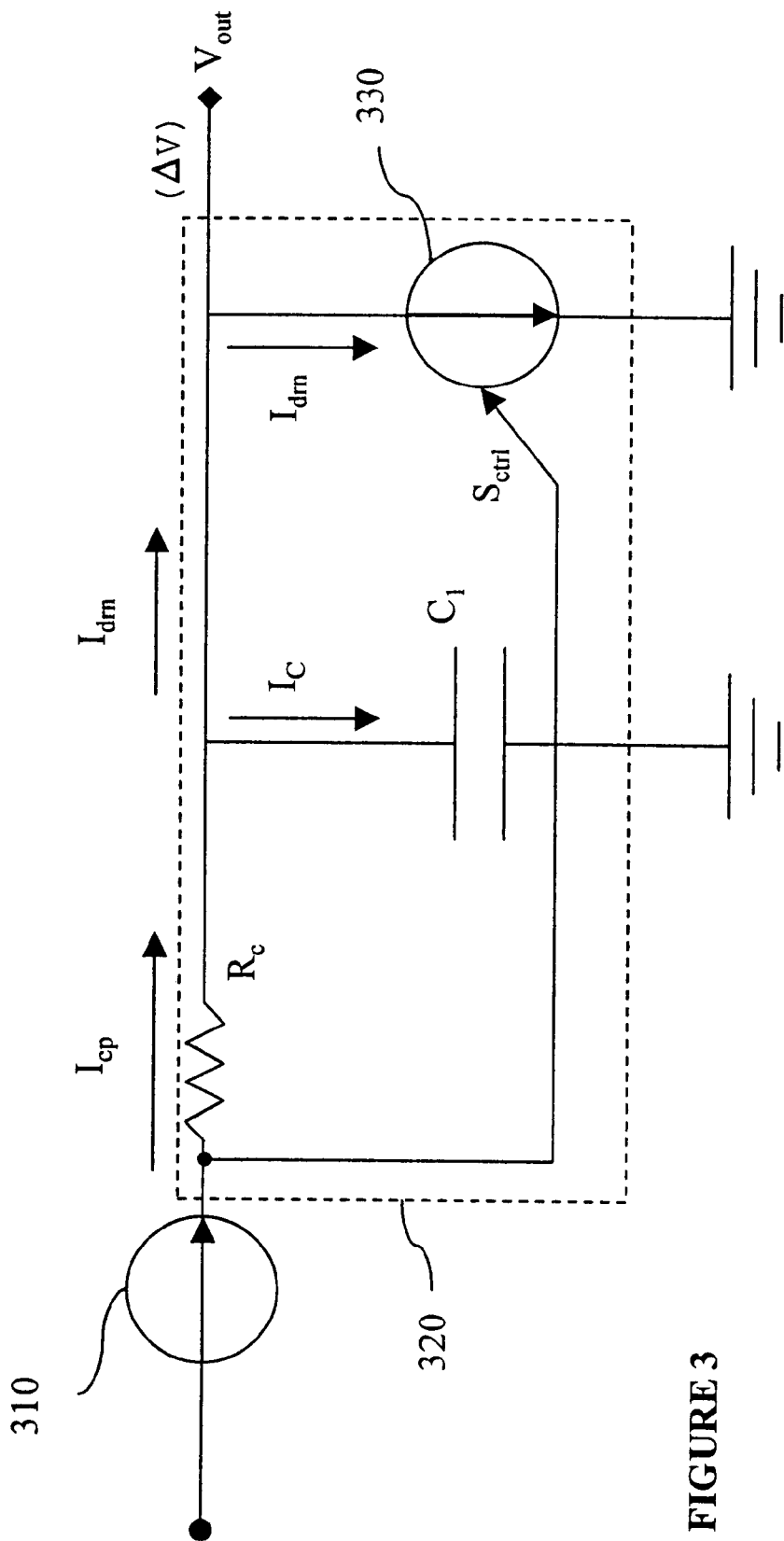
FIG. 3 illustrates a diagram of an embodiment of a loop filter constructed according to the present invention.

Turning now to FIG. 3, illustrated is a diagram of an embodiment of a loop filter 320 constructed according to the present invention. The loop filter 320 includes a capacitor $C_1$, and is coupled to a charge pump 310. In addition, the loop filter 320 further includes a control resistor $R_c$ coupled in series with the charge pump 310, as well as a current bypass circuit 330 coupled in parallel with the capacitor $C_1$.

As illustrated, the charge pump 310 produces a charge pump current $I_{cp}$. As a function of the charge pump current $I_{cp}$ flowing therethrough, a voltage of the control resistor $R_c$ changes. Thus, a control signal $S_{ctrl}$ is generate when the charge pump current $I_{cp}$ passes through the control resistor $R_c$, and this control signal $S_{ctrl}$ is used to control the current bypass circuit 330. Since the current bypass circuit 330 is coupled in parallel with the capacitor $C_1$, a portion of the charge pump current $I_{cp}$ is prevented from flowing to the capacitor $C_1$. More specifically, for the illustrated embodiment, Kirchhoff's current rule reveals the equation set forth below.

$$I_{cp} = I_{drn} + I_C \text{ or, } I_C = I_{cp} - I_{drn}$$

As demonstrated by the equation, the charge pump current $I_{cp}$ is divided into a capacitor current $I_c$ and a drain current $I_{drn}$. The drain current $I_{drn}$ flows through the current bypass circuit 330 at a predetermined rate, which is proportional to the current flow through the capacitor $C_1$. In other words, following Kirchhoff's current rule, the desired capacitor current $I_c$ may be established by adjusting the drain current $I_{drn}$ flowing through the current bypass circuit 330. In addition, changing the drain current $I_{drn}$ with the current bypass circuit 330 also changes the voltage drop across the control resistor $R_c$. In turn, the voltage change across the control resistor $R_c$ alters the control signal $S_{ctrl}$ generated therefrom. With these relationships in mind, substituting for the charge/discharge rate $R_{c/d}$ equation discussed above results in the new charge/discharge rate $R_{c/d}$ equation set forth below.

$$R_{c/d} = \frac{I_{cp} - I_{drn}}{C_1} = \frac{Ic}{C_1}$$

This equation reveals that by coupling the current bypass circuit 330 in parallel with the capacitor $C_1$, the charge/discharge rate $R_{c/d}$ Of the capacitor $C_1$ is now directly proportional with the capacitor current $I_c$ rather than the overall charge pump current $I_{cp}$ as seen in the prior art. Thus, when compared to prior art loop filters, a loop filter according to the present invention essentially provides a capacitance multiplier. An equation demonstrating this principle may be shown as:

$$\frac{Ic}{C_1} = \frac{I_{cp}}{C_{eq}}$$

where $C_{eq}$ represents the equivalent capacitance needed by prior art loop filters to achieve the results of a loop filter constructed according to the present invention. Rearranging the above equation:

$$C_{eq} = \frac{I_{cp}}{Ic} \cdot C_1$$

where $I_{cp}/I_C$ will be a number greater than one. Carrying the equation further, where $I_{cp}/I_C$ is equivalent to a multiplication factor (K) of the capacitor $C_1$, the following formula may be further derived.

$$C_{eq} = K \cdot C_1$$

According to this equation, an equivalent capacitor $C_{eq}$ used in prior art loop filters to achieve analogous results is required to be larger than the capacitor $C_1$ used with the present invention by a factor of (e.g., multiplied by) the multiplication factor K. Thus, the present invention provides the desired approach of increasing capacitance without using excess surface area with large equivalent capacitors (which causes increased costs), as discussed above.

These relationships may be further revealed using an example, with continuing reference to FIG. 3. If the charge/discharge rate $R_{c/d}$ is desired to be slower than was previously possible for a given capacitance, then, in accordance with the principles of the present invention, the capacitor current $I_c$ flowing through the capacitor $C_1$ should be reduced. For example, if only 20% (⅕) of the charge pump current $I_{cp}$ is wanted to flow through the capacitor $C_1$ as capacitor current $I_c$, then the current bypass circuit 330 should be adjusted such that the drain current $I_{drn}$ is about four times greater than the capacitor current $I_c$. Then, according to the new charge/discharge rate $R_{c/d}$ equation above, 80% (⅘) of the charge pump current $I_{cp}$ will flow through the current bypass circuit 330 as drain current $I_{drn}$, while 20% (⅕) will flow through the capacitor $C_1$ as capacitor current $I_c$. This would result in a drop in the charge/discharge rate $R_{c/d}$ of the capacitor $C_1$ to about 20% of the original rate (an 80% reduction).

In short, by manipulating the charge/discharge rate $R_{c/d}$ of the capacitor $C_1$ according to the present invention, the loop filter 320 operates as if a capacitor five times larger than the capacitor $C_1$ illustrated in FIG. 3 is present. As discussed above, for those PLL circuits used for frequency multiplication that require large capacitors, greater frequency multiplication of an incoming signal may be accomplished, than previously available in the prior art, for a given size capacitor $C_1$ and a given amount of charge pump current $I_{mps}$.

For example, if the original capacitor current $I_c$ for the capacitor $C_1$ resulted in a charge/discharge rate $R_{c/d}$ which provided a maximum frequency multiplication from 1 to about 32 times, then reducing the capacitor current $I_c$ for the capacitor $C_1$ according to the present invention results in a charge/discharge rate $R_{c/d}$ which may provide a frequency multiplication from 1 to about 128 times or more. Thus, in essence, coupling the current bypass circuit 330 in parallel with the capacitor $C_1$ in accordance with the present invention, results in a "capacitor multiplier" that reduces the charge/discharge rate $R_{c/d}$ of the capacitor $C_1$. The effects provided by the present invention are output from the loop filter 320 as an output signal $V_{out}$, used to control an oscillator (not illustrated) within a PLL architecture.

Figure 4:
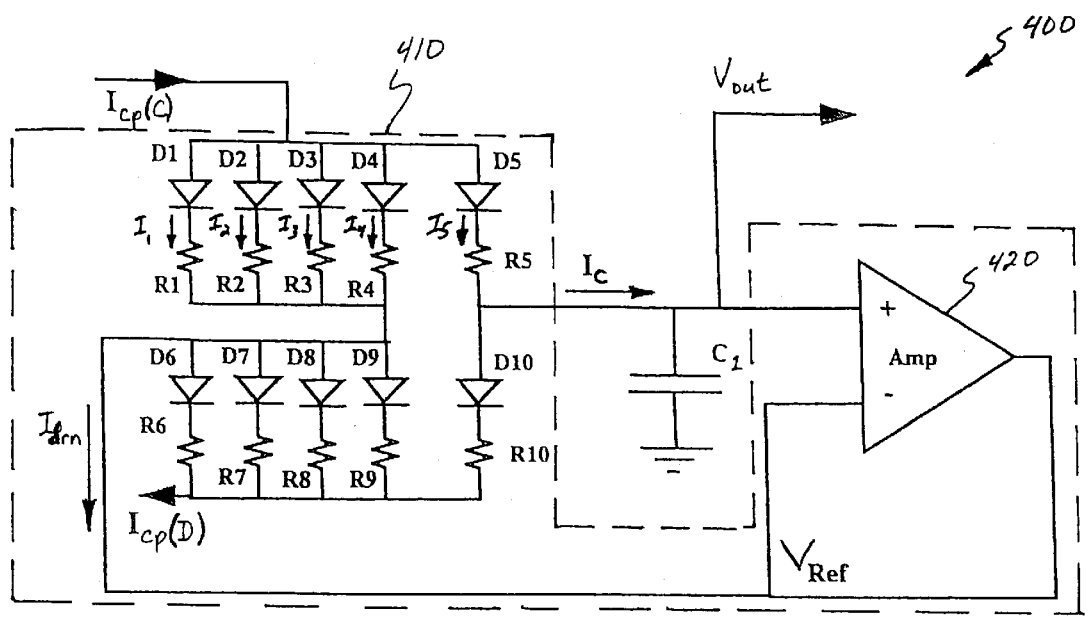
FIG. 4 illustrates a diagram of another embodiment of a loop filter constructed according to the principles of the present invention.

Looking now at FIG. 4, illustrated is a diagram of another embodiment of a loop filter 400 constructed according to the principles of the present invention. In this embodiment, the loop filter 400 includes a current bypass circuit 410, which includes first, second, third, fourth and fifth charging diodes D1–D5 series-coupled to corresponding first, second, third, fourth and fifth charging resistors R1–R5, respectively. In addition, the current bypass circuit 410 includes sixth, seventh, eighth, ninth and tenth discharging diodes D6–D10 series-coupled to corresponding sixth, seventh, eighth, ninth and tenth discharging resistors R6–R10, respectively. An amplifier 420 is further included in the current bypass circuit 410, and the entire current bypass circuit 410 is coupled to a capacitor $C_1$. The capacitor $C_1$ produces a voltage signal to a VCO, which serves as the output signal $V_{out}$ to control the VCO.

In one embodiment, a charge pump (not illustrated) provides a charge current $I_{cp(C)}$ from P-channel transistors (not illustrated) in the charge pump and a discharge current $I_{cp(D)}$ from N-channel transistors (not illustrated) in the charge pump. Of course, other components or circuits may be used in the charge pump to provide the charge and discharge currents $I_{cp(C)}$, $I_{cp(D)}$ and those devices may or may not be switching devices, for example metal oxide semiconductor (MOS) switching devices. Moreover, while bipolar diodes are illustrated in the loop filter 400, those devices need not be bipolar devices to fall within the scope of the present invention. In an alternative embodiment, the charge pump may be excluded and a phase detector (not illustrated) may be directly coupled to the circuit. Of course, the present invention is broad enough to encompass other circuit designs, and is not limited to any particular one.

In accordance with conventional practice, and referring to an embodiment having a charge pump, the charge current $I_{cp(C)}$ is applied from the charge pump to the loop filter 400 to charge the capacitor $C_1$, while the discharge current $I_{cp(D)}$ is used to discharge the capacitor $C_1$. Having this configuration, four modes of operation for the loop filter 400 are illustrated in Table 1.

TABLE 1

| MODE | $I_{cp(C)}$ | $I_{cp(D)}$ |
| --- | --- | --- |
| Tristate | OFF | OFF |
| Charge $C_1$ | ON | OFF |
| Discharge $C_1$ | OFF | ON |
| Reset | ON | ON |

In one aspect of the present invention, if the charging and discharging diodes D1–D10, and the charging and discharging resistors R1–R10, are equal in respective values, the output signal $V_{out}$ will be substantially equal to a reference voltage $V_{ref}$ of the amplifier 420. In this configuration, the amplifier 420 is connected as a voltage follower and ensures that the reference voltage $V_{ref}$ remains substantially equal to the output signal $V_{out}$.

During charging of the capacitor $C_1$, the charge current $I_{cp(C)}$ is divided equally into the five charging branches, D1/R1, D2/R2, D3/R3, D4/R4, and D5/R5, where each branch provides ⅕ of the charge current $I_{cp(C)}$ since in this example the charging diodes D1–D5 and the charging resistors R1–R5 have the same respective values. Then, the current through the first four charging branches D1/R1, D2/R2, D3/R3, D4/R4 reunites where the charging branches come together to become a drain current $I_{drn}$. The drain current $I_{drn}$ is fed to the output of the amplifier 420, as illustrated. The current in the fifth charging branch D5/D5 is all that remains of the original charge current $I_{cp(C)}$, and becomes a capacitor current $I_c$ to charge the capacitor $C_1$. In accordance with the present invention, this capacitor current $I_c$ is equal to only ⅕ of the charge current $I_{cp(C)}$, and results in a smaller charge/discharge rate $R_{c/d}$ of the capacitor $C_1$ without increasing the size of the capacitor $C_1$ then if the entire charge current $I_{cp(C)}$ was fed through the capacitor $C_1$, as occurs in the prior art.

Similarly, during discharging of the capacitor $C_1$, the discharge current $I_{cp(D)}$ is also divided equally into five discharge branches, D6/R6, D7/R7, D8/R8, D9/R9, and D10/R10, where each branch provides ⅕ of the discharge current $I_{cp(D)}$ since in this example the discharging diodes D6–D10 and the discharging resistors R6–R10 have the same respective values. The current through the first four discharge branches D6/R6, D7/R7, D8/R8, D9/R9 reunites where the branches come together to become the drain current $I_{drn}$. During discharging, the drain current $I_{drn}$ is again fed from the output of the amplifier 420. Thus, as with charging, the capacitor current $I_c$ flowing through the capacitor $C_1$ during discharge is reduced to about 20% than is found in the prior art. Of course, the present invention is not limited to five charge or discharge branches. Rather, any number of branches may be employed to reduce the current through the capacitor $C_1$ and thereby reduce its charge/discharge rate $R_{c/d}$ in accordance with the principles of the present invention discussed herein.

Whether charging or discharging the capacitor $C_1$, the equivalent capacitance of a loop filter may be determined from:

$$C_{eq}=C_1 \cdot K$$

where the multiplication factor K of the capacitor $C_1$ may be determined from:

$$K = \frac{I_1 + I_2 + I_3 + I_4 + I_5}{I_5}.$$

Figure 5:
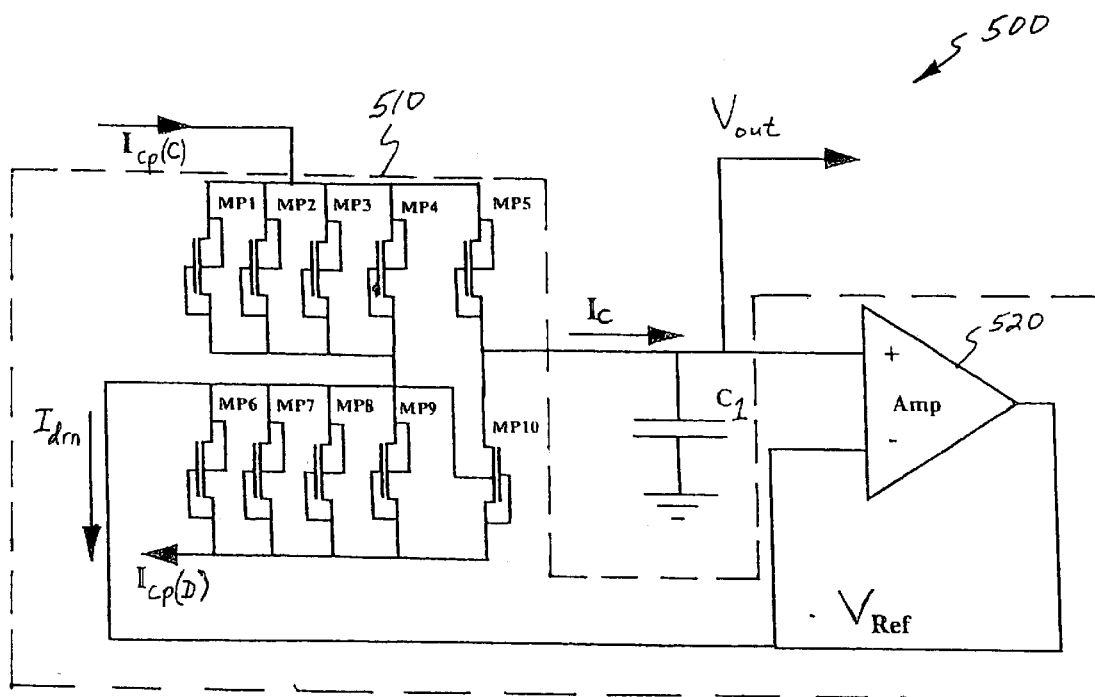
FIG. 5 illustrates a diagram of yet another embodiment of a loop filter constructed according to the principles of the present invention.

Turning to FIG. 5, illustrated is a diagram of yet another embodiment of a loop filter 500 constructed according to the principles of the present invention. As with the previous embodiment, the loop filter 500 includes a current bypass circuit 510 for syphoning charge pump current $I_{cp(C)}$, $I_{cp(D)}$ away from a capacitor $C_1$, in accordance with the principles discussed above. However, as illustrated, now the loop filter 500 includes first, second, third, fourth and fifth charging MOS transistors MP1–MP5, and sixth, seventh, eighth, ninth and tenth discharging MOS transistors MP6–MP10. Although MOS transistors are shown in FIG. 5, those skilled in the art understand that other switching devices or circuits may be substituted therefor, without departing from the scope of the present invention.

As before, an amplifier 520 is further included as part of the current bypass circuit 510, to assist in syphoning the charge pump current $I_{cp(C)}$, $I_{cp(D)}$ therefrom, and the entire current bypass circuit 510 is coupled to a capacitor $C_1$. The capacitor $C_1$ produces an output signal $V_{out}$ to control the VCO. In this embodiment, a charge pump (not illustrated) still provides the charge and discharge currents $I_{cp(C)}$, $I_{cp(D)}$ to the current bypass circuit 510 and capacitor $C_1$ to charge and discharge the capacitor $C_1$, respectively, to create the output signal $V_{out}$. The modes of operation of the loop filter 500 are the same as illustrated in Table 1 above.

As with the embodiment illustrated in FIG. 4, the equivalent capacitance of a loop filter may be determined from:

$$C_{eq}=C_1 \cdot K$$

where the multiplication factor K of the capacitor $C_1$ may be determined from:

$$K = \frac{I_1 + I_2 + I_3 + I_4 + I_5}{I_5}.$$

Figure 6:
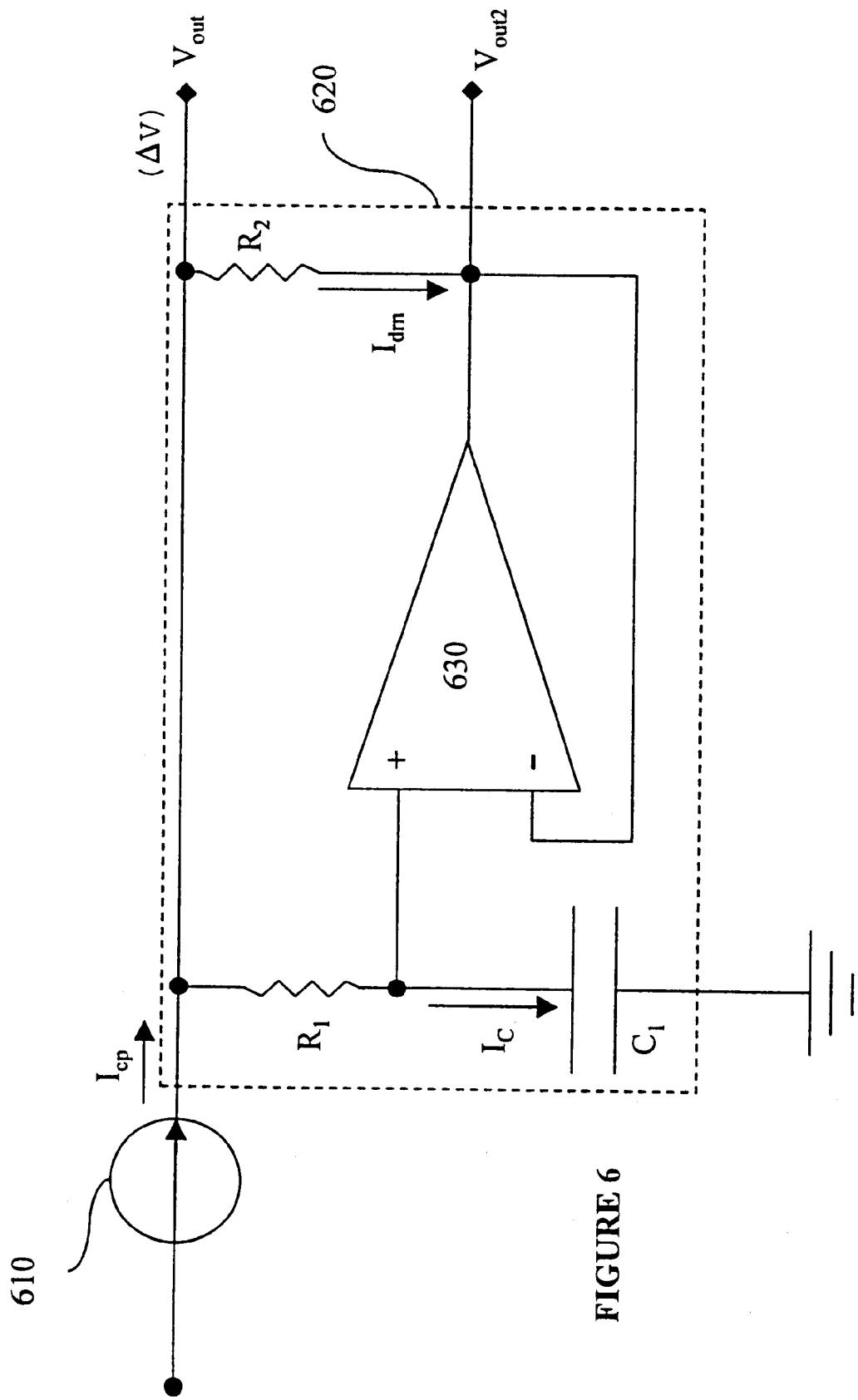
FIG. 6 illustrates a diagram of still a further embodiment of a loop filter constructed according to the principles of the present invention.

Turning to FIG. 6, illustrated is a diagram of still a further embodiment of a loop filter 620 constructed according to the principles of the present invention. Also illustrated is a charge pump 610 generating a charge pump current $I_{cp}$ that is fed into the loop filter 620, as described in detail above. A current bypass circuit, illustrated as an amplifier 630, is also shown to provide the drain current $I_{drn}$ used to lower the charge/discharge rate of a capacitor $C_1$, in accordance with the principles of the present invention. First and second resistors $R_1$, $R_2$ are included to help control the drain current $I_{drn}$ drawn by the amplifier 630, and a capacitor current $I_c$ flowing through the capacitor $C_1$.

In this embodiment, an equivalent capacitance $C_{eq}$ may still be determined from:

$$C_{eq}=C_1 \cdot K$$

where the multiplication factor K may be determined from:

$$K = \frac{I_c + I_{dm}}{I_c}.$$

The values of the first and second resistors $R_1$, $R_2$ may also be changed to determine the appropriate equivalent capacitance $C_{eq}$ for the capacitor $C_1$. As before, the output signal $V_{out}$ controls the VCO (not illustrated). By providing a resistor ($R_1$) in series with the capacitor $C_1$, the embodiment illustrated in FIG. 6 is suitable for creating a capacitance multiplier in circuits requiring an RC filter, such as a "no zero feed forward" PLL circuit. For application where a resistor is not required, a second output signal $V_{out2}$ may be used instead.

Thus, by providing a current bypass circuit that may be used to syphon-off a portion of the charge pump charge or discharge current, the present invention provides a way of reducing the charge/discharge rate of the capacitor(s) in a loop filter without the need to increase the size of the capacitor(s). As discussed above, by reducing the charge pump current flowing through the capacitor(s), the capacitance of the capacitor(s) is effectively multiplied without the added expense and wasted surface area typically associated with increasing the size of the capacitor(s) to achieve the same results.

Those skilled in the art realize the frequency multiplication possibilities gained by the present invention. For example, where prior art frequency synthesis circuits are typically limited to a maximum multiplication of 1 to about 32 times, due to the practical limitations of relatively large capacitor sizes mentioned above, the present invention may provide multiplications from 1 to about 128 times or more without having to increase the size of the capacitor(s) in the loop filter used within the PLL circuit. Conversely, the manufacturing costs and associated loss of integrated circuit (IC) chip surface area necessary to arrive at such a result would be too excessive if systems found in the prior art were used. Moreover, this "capacitor multiplier" of the present invention is employable in almost any programmable logic device architecture, while retaining benefits such as those described above.

Although the present invention has been described in detail, those skilled in the art should understand that they can make various changes, substitutions and alterations herein without departing from the spirit and scope of the invention in its broadest form.

What is claimed is:

1. A loop filter, comprising:
    a capacitor having a charge rate proportional to a current therethrough and configured to provide an output signal therefrom; and
    a current bypass circuit, coupled to said capacitor, configured to reduce said current through said capacitor and thereby reduce said charge rate of said capacitor.

2. The loop filter as recited in claim 1 wherein said current bypass circuit comprises at least one resistor, series-coupled to a diode, and an amplifier.

3. The loop filter as recited in claim 1 wherein said current bypass circuit comprises at least one metal oxide semiconductor device and an amplifier.

4. The loop filter as recited in claim 1 wherein said current bypass circuit comprises a current generator circuit.

5. The loop filter as recited in claim 1 wherein said current through said capacitor is reduced by about 80 percent thereby reducing said charge rate of said capacitor by about 80 percent.

6. The loop filter as recited in claim 1 wherein said output signal is smaller than said current through said capacitor by a predetermined multiplication factor.

7. A loop filter, comprising:
    a resistor having a voltage proportional to a current therethrough and configured to generate a control signal therefrom;
    a capacitor having a charge rate proportional to a current therethrough coupled to said resistor and configured to provide an output signal therefrom;
    a current bypass circuit, coupled to said capacitor and said resistor, configured to reduce said current through said capacitor and said resistor responsive to said control signal, thereby reducing said charge rate of said capacitor and said voltage across said resistor.

8. The loop filter as recited in claim 7 wherein said current bypass circuit comprises at least one resistor and an amplifier.

9. The loop filter as recited in claim 7 wherein said output signal is a voltage control signal.

10. The loop filter as recited in claim 7 wherein said current through said capacitor is reduced by about 80 percent thereby reducing said charge rate of said capacitor by about 80 percent and said voltage across said resist or by about 80 percent.

11. A method of generating a control signal, comprising:
    providing current through a capacitor having a charge rate proportional to said current and creating an output signal therefrom;
    coupling a current bypass circuit with said capacitor; and
    reducing said current through said capacitor with said current bypass circuit, thereby reducing said charge rate of said capacitor.

12. The method as recited in claim 11 wherein said current bypass circuit comprises at least one resistor, series-coupled to a diode, and an amplifier.

13. The method as recited in claim 11 wherein said current bypass circuit comprises at least one metal oxide semiconductor device and an amplifier.

14. The method as recited in claim 11 wherein said current bypass circuit comprises a current generator circuit.

15. The method as recited in claim 11 wherein said reducing said current includes reducing said current through said capacitor by about 80 percent and thereby reducing said charge rate of said capacitor by about 80 percent.

16. The method as recited in claim 11 wherein said creating said output signal includes creating an output signal smaller than said current through said capacitor by a predetermined multiplication factor.

17. A method of generating a control signal, comprising:
    providing a current through a resistor having a voltage therethrough proportional to said current and through a capacitor coupled thereto having a charge rate proportional to said current;
    generating an output signal based on said charge rate;
    reducing said current through said capacitor and said resistor with a current bypass circuit coupled to said capacitor and said resistor, thereby decreasing said charge rate of said capacitor and decreasing said voltage across said resistor.

18. The method as recited in claim 17 wherein said current bypass circuit comprises at least one resistor and an amplifier.

19. The method as recited in claim 17 wherein said output signal is a voltage control signal.

20. The method as recited in claim 17 wherein said reducing includes reducing said current through said capacitor by about 80 percent, thereby decreasing said charge rate of said capacitor by about 80 percent and decreasing said voltage across said resistor by about 80 percent.

21. A phase-locked loop (PLL) circuit, comprising:
   a comparator circuit configured to compare a phase of a feedback signal to a phase of an input signal and generate a signal as a function of said comparison;
   a charge pump configured to generate a current as a function of said signal from said comparator circuit;
   a loop filter, comprising:
      a capacitor having a charge rate proportional to said current and configured to provide an output signal therefrom, and
      a current bypass circuit, coupled to said capacitor, configured to reduce said current through said capacitor and thereby reduce said charge rate of said capacitor; and
   an oscillator configured to generate an output clock signal as a function of said output signal from said loop filter.

22. The PLL circuit as recited in claim 21 wherein said current bypass circuit comprises at least one resistor, series-coupled to a diode, and an amplifier.

23. The PLL circuit as recited in claim 21 wherein said current bypass circuit comprises at least one metal oxide semiconductor device and an amplifier.

24. The PLL circuit as recited in claim 21 wherein said current bypass circuit comprises a current generator circuit.

25. The PLL circuit as recited in claim 21 wherein said current through said capacitor is reduced by about 80 percent thereby reducing said charge rate of said capacitor by about 80 percent.

26. The PLL circuit as recited in claim 21 wherein said output signal from said loop filter is smaller than said current through said capacitor by a predetermined multiplication factor.

27. A phase-locked loop (PLL) circuit, comprising:
   a comparator circuit configured to compare a phase of a feedback signal to a phase of an input signal and generate a signal as a function of said comparison;
   a charge pump configured to generate a current as a function of said signal from said comparator circuit;
   a loop filter, coupled to said charge pump, comprising:
      a resistor having a voltage thereacross proportional to said current,
      a capacitor coupled to said resistor and having a charge rate proportional to said current and configured to provide an output signal therefrom, and
      a current bypass circuit, coupled to said capacitor and said resistor, configured to reduce said current through said capacitor and said current through said resistor, thereby decreasing said charge rate of said capacitor and decreasing said voltage across said resistor; and
   an oscillator configured to generate an output clock signal as a function of said output signal.

28. The PLL circuit as recited in claim 27 wherein said current bypass circuit comprises at least one resistor and an amplifier.

29. The PLL circuit as recited in claim 27 wherein said output signal is a voltage control signal.

30. The PLL circuit as recited in claim 27 wherein said current through said capacitor is reduced by about 80 percent thereby reducing said charge rate of said capacitor by about 80 percent and said voltage across said resistor by about 80 percent.

* * * * *